(12) United States Patent
Kim et al.

(10) Patent No.: US 8,265,581 B2
(45) Date of Patent: Sep. 11, 2012

(54) TRANSCEIVER USING MILLIMETER-WAVE

(75) Inventors: Bong-Su Kim, Daejeon (KR); Woo-Jin Byun, Daejeon (KR); Min-Soo Kang, Daejeon (KR); Kwang-Seon Kim, Daejeon (KR); Tae-Jin Chung, Daejeon (KR); Myung-Sun Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 217 days.

(21) Appl. No.: 12/638,293

(22) Filed: Dec. 15, 2009

(65) Prior Publication Data

US 2010/0151799 A1    Jun. 17, 2010

(30) Foreign Application Priority Data

Dec. 16, 2008    (KR) .................. 10-2008-0128178

(51) Int. Cl.
*H04B 7/00*    (2006.01)
*H04B 1/38*    (2006.01)
(52) U.S. Cl. ............... 455/249.1; 455/73; 455/240.1
(58) Field of Classification Search ............ 455/522, 455/69, 121, 91, 73, 88, 240.1, 249.1
See application file for complete search history.

(56) References Cited

U.S. PATENT DOCUMENTS

| | | | | |
|---|---|---|---|---|
| 4,392,245 A | * | 7/1983 | Mitama | 455/115.1 |
| 5,337,006 A | * | 8/1994 | Miyazaki | 330/130 |
| 5,752,170 A | | 5/1998 | Clifford | |
| 6,308,080 B1 | * | 10/2001 | Burt et al. | 455/522 |
| 6,801,784 B1 | * | 10/2004 | Rozenblit et al. | 455/522 |
| 7,218,951 B2 | * | 5/2007 | Rozenblit et al. | 455/522 |
| 7,430,435 B2 | * | 9/2008 | Choi et al. | 455/522 |
| 7,706,760 B2 | * | 4/2010 | Rozenblit et al. | 455/127.1 |
| 2003/0060171 A1 | | 3/2003 | Lovberg et al. | |

FOREIGN PATENT DOCUMENTS

| | | |
|---|---|---|
| KR | 10-0303703 | 2/1996 |
| KR | 2005-502233 | 1/2005 |
| WO | 94/20888 | 9/1994 |
| WO | 03/001701 A2 | 1/2003 |

* cited by examiner

*Primary Examiner* — Sonny Trinh
(74) *Attorney, Agent, or Firm* — Staas & Halsey LLP

(57) ABSTRACT

Provided is a transceiver using a millimeter-wave (MM-wave). The transceiver determines output power of a transmitting signal according to a receiving signal of a receiving end in the same device so that a possible loss value occurring in the air may be predicted. By doing so, performance of a whole link budget may be enhanced, and the transmitting signal may be rapidly controlled.

4 Claims, 4 Drawing Sheets

TRANSCEIVER USING MILLIMETER-WAVE

CROSS-REFERENCE TO RELATED PATENT APPLICATION

This application claims the benefit of Korean Patent Application No. 10-2008-0128178, filed on Dec. 16, 2008, in the Korean Intellectual Property Office, the disclosure of which is incorporated herein in its entirety by reference.

BACKGROUND OF THE INVENTION

1. Field of the Invention

The present invention relates to a transceiver in a point-to-point wireless communication system, and more particularly, to a transceiver that adjusts power of a transmitting signal by using power of a receiving signal in a millimeter-wave (MM-wave) point-to-point fixed communication system.

2. Description of the Related Art

When millimeter-wave (MM-wave) wireless communication is performed, it is necessary to maintain a line-of-sight (LOS) between a transmitter and a receiver and to use a narrow pencil beam of which angle is under 1 degree. Thus, when the transmitter and the receiver are installed, a correct position of an antenna is important.

Since the transmitter and the receiver are installed in a high location such as outside on a rooftop, the antenna may sway due to a strong wind, which may result in a noisy receiving signal, and a difference between values of a loss occurring in a link path may vary according to an amount of rainfall. Thus, it is necessary to provide a method of monitoring such a wireless link loss in real-time and changing output power according to a result of the monitoring.

SUMMARY OF THE INVENTION

The present invention provides a transceiver that adjusts output power of a transmitting signal in real-time by using power of a receiving signal of the same device in a millimeter-wave (MM-wave) fixed communication system, whereby the transceiver may deal with changes occurring in real-time in a wireless space and have an enhanced function.

The present invention also provides a transceiver that uses magnitude of an input signal of a receiver as a control signal for controlling output power of a transmitter in an MM-wave wireless point-to-point communication system.

According to an aspect of the present invention, there is provided a transceiver including a transmitter for generating a transmitting signal from an input signal and transmitting the transmitting signal to an antenna; a receiver for reconstructing a receiving signal received by the antenna; and a power detector for outputting a control signal for controlling output power of the transmitting signal according to power of the receiving signal.

The power detector may detect power of an output signal of one from among an intermediate frequency (IF) end of the receiver and a radio frequency (RF) end of the receiver.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
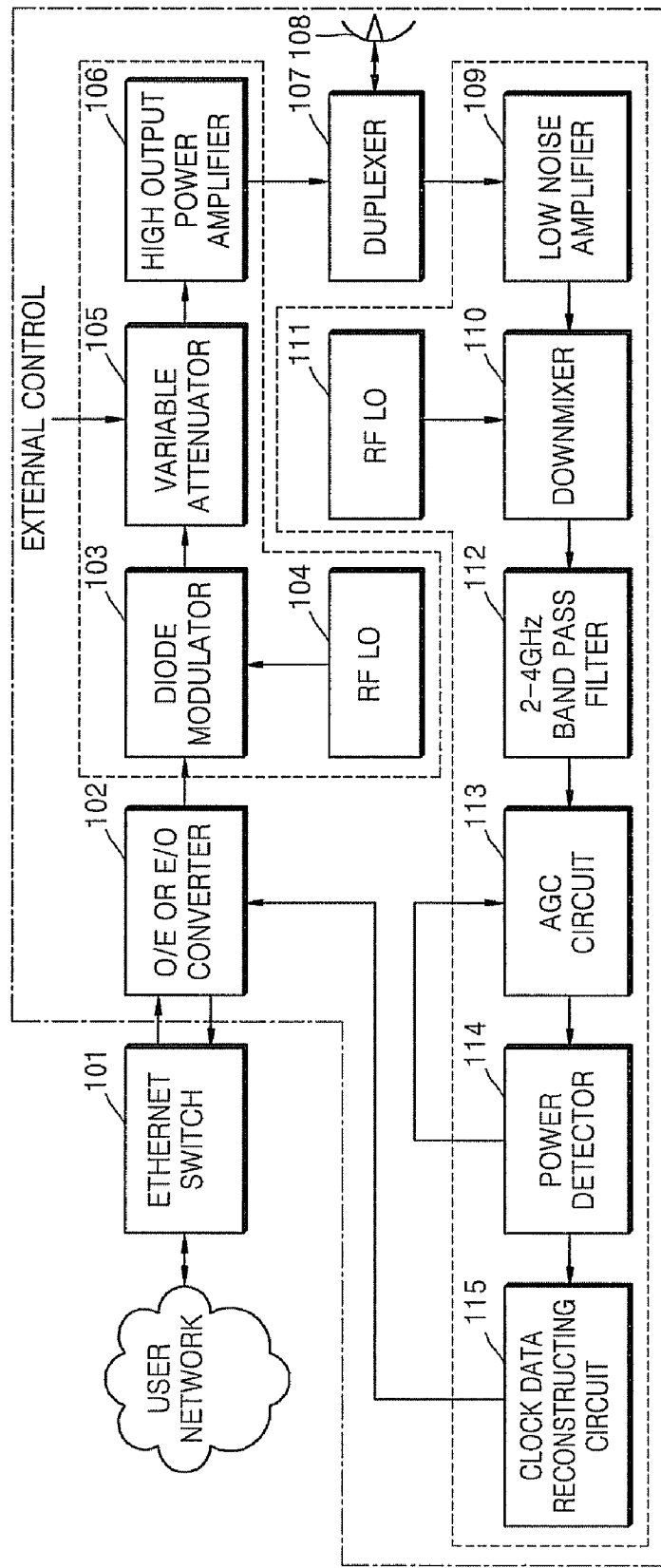
FIG. 1 is a concept diagram of a millimeter-wave (MM-wave) point-to-point fixed communication transmitting and receiving system according to the related art.

The present invention will now be described more fully with reference to the accompanying drawings, in which exemplary embodiments of the invention are shown. Like reference numerals denote like elements throughout the specification. In the following description, well-known functions or constructions are not described in detail since they would obscure the invention with unnecessary detail.

Also, when a part "includes" or "comprises" an element, unless there is a particular description contrary thereto, the part can further include other elements, not excluding the other elements. In the following description, terms such as "unit" and "block" indicate a unit for processing at least one function or operation, wherein the unit and the block may be embodied as hardware or software or embodied by combining hardware and software.

The present invention includes a scheme in which a variable attenuator arranged in a transmitting unit receives information about power of a receiving signal from a power detector arranged in a receiving unit and thus adjusts output power by adjusting an attenuation amount.

FIG. 1 is a concept diagram of a millimeter-wave (MM-wave) point-to-point fixed communication transmitting and receiving system according to the related art.

As illustrated in FIG. 1, a wireless transmitting and receiving system includes a transmitting unit including an Ethernet switch 101, an optical to electrical (O/E) or electrical to optical (E/O) converter 102, a diode modulator 103, a radio frequency (RF) local oscillator (LO) 104, a variable attenuator 105, and a high output power amplifier 106, a receiving unit including a low noise amplifier 109, a downmixer 110, an RF LO 111, a band pass filter 112, an automatic gain control (AGC) circuit 113, a power detector 114, and a clock data reconstructing circuit 115, a duplexer 107, and an antenna 108. Hereinafter, an operation of a MM-wave transmitting and receiving system having the aforementioned structure according to the related art will now be described.

In the case of transmission, data input to the Ethernet switch 101 via a user network is converted by the O/E or E/O converter 102 so that an optical signal of the data is converted into an electrical signal that is input to the diode modulator 103. The electrical signal input to the diode modulator 103 is modulated into an on-off keying (OOK) signal. After that, power of the OOK signal is adjusted in the variable attenuator 105 and by an external control signal, and then is output. An output signal of the variable attenuator 105 is amplified by the high output power amplifier 106 at an end of the transmitting unit, and is emitted via the duplexer 107 and the antenna 108. An output from the RF LO 104 in the transmitting unit is applied to the diode modulator 103.

In the case of reception, a signal emitted from another transmitting unit is input to the receiving unit via the antenna 108 and the duplexer 107.

An output signal of the duplexer 107 is low-noise amplified by the low noise amplifier 109, and then is converted into a low frequency signal by the downmixer 110. An out-of-band signal of an output signal of the downmixer 110 is removed by the band pass filter 112, and for efficient data reconstruction, the output signal of the downmixer 110 is output predetermined power by the AGC circuit 113 and the power detector 114. The output signal of the power detector 114 is reconstructed to clocks and data by the clock data reconstructing circuit 115, and then is output to the user network via the O/E or E/O converter 102 that functions to convert an electrical signal into an optical signal. An output from an RF LO 111 in the receiving unit is applied to the downmixer 110.

The variable attenuator 105 of the transmitting unit is used when an MM-wave point-to-point communication device is installed, and is designed to be manually controlled from the outside so as to compensate for a loss value due to a distance between the MM-wave point-to-point communication devices. That is, by checking receiving power of a remote receiving end, a value of the variable attenuator 105 is adjusted until a receiving signal has a desired power value. However, it is difficult to initially install such an MM-wave point-to-point communication device and it is not possible to compensate for a wireless link loss due to a shake of the antenna 108 or rainfall attenuation.

According to the related art, in order to control output power of a transmitter, a receiver receives a signal, measures the magnitude of the received signal, loads a value of the magnitude on a frame, and transmits the value to a central processing unit (CPU). Also, the transmitter transmits a level of the output power to the CPU. The CPU collects information about the value and the level, and controls an output power value of each link. However, it is complicated to realize such a scheme, and costs increase due to the necessity of communication between the CPU in the transmitter/receiver and a switch for data transmission.

In a point-to-point communication system that operates in a 70/80 GHz band, when weather and air conditions change, a loss value of a link path is also changed so that a receiving power value is changed.

An example of calculating the loss value in the 70/80 GHz band will now be described.

It is assumed that there is a system that is required to be designed in consideration that a distance between the antennas of a transmitter and a receiver may vary from at least 100 meters (m) to 1000 m and rainfall may be 45 mm per hour (45 mm/hr).

First, since the distance is in the range from 100 m to 1000 m, a difference of 20 decibels (dB) may occur in a receiving power. Also, the rainfall of 45 mm per hour causes attenuation of 18 dB per 1 kilometer (km). When considering these two factors, conditions causing a maximum power difference between a minimum receiving power and a maximum receiving power of the receiver are described below.

Minimum receiving power: In the case where rain of 45 mm/hr falls and the distance is 1 km.

Maximum receiving power: In the case where the sun shines and the distance is 100 m.

At this time, a power difference between the aforementioned conditions is 20+18=38 dB which is difficult for the receiver to process with a dynamic range of the receiver. Thus, it is necessary for the receiver to share a power adjustment range with the transmitter by adjusting power of the transmitter.

In the case of a power change according to the distance, it is assumed that the receiver input power is set to have a fixed value by using variable attenuation of the transmitter when the antenna is initially installed. By doing so, a power difference of 18 dB occurs due to rainfall attenuation, and corresponds to an 8 times longer link distance in a free space. That is, it is possible for a receiver at a link distance of 1 km to receive power sufficient to reconstruct data at a distance of 8 km. However, the power interferes with another system.

Figure 2:
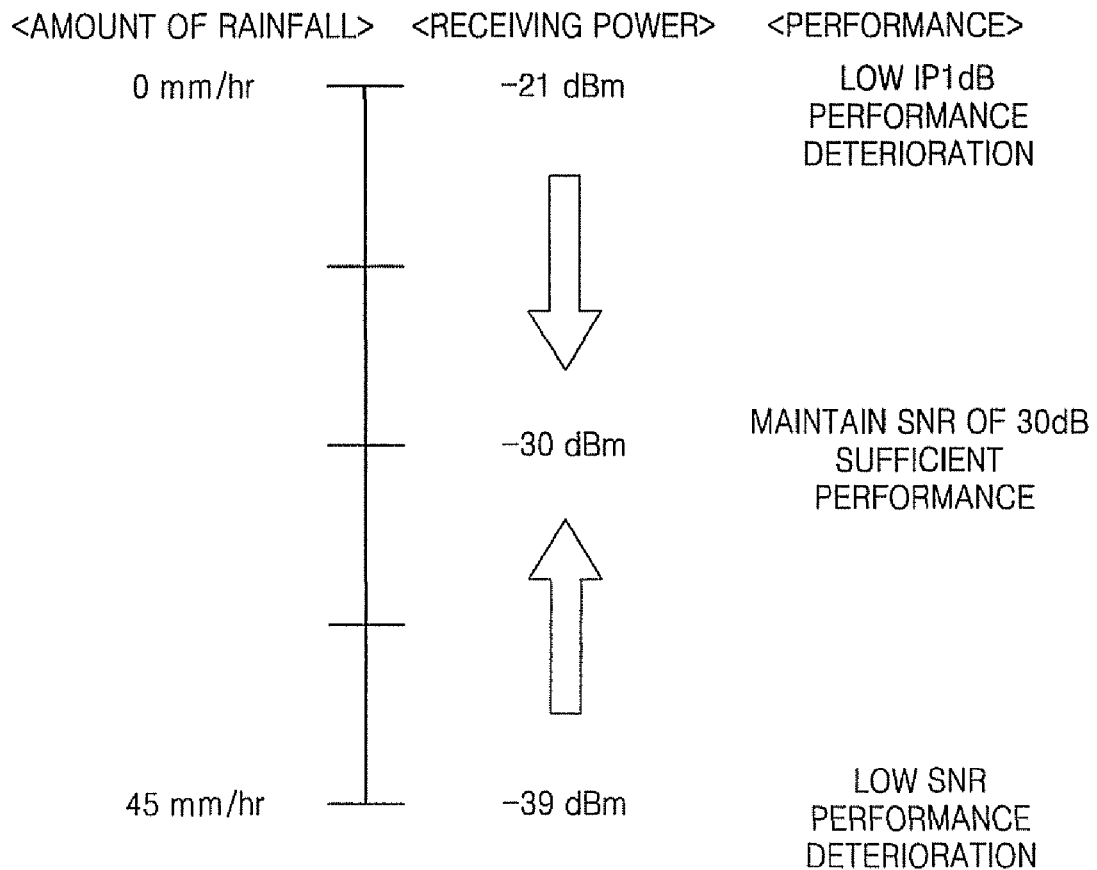
FIG. 2 shows a relation between an amount of rainfall and receiving power, and a change in performance according to the relation.

FIG. 2 shows a relation between an amount of rainfall and receiving power, and a change in performance according to the relation.

Referring to FIG. 2, a link budget of a communication system is calculated based on a maximum rainfall amount of 45 mm/hr so that a value of receiving power input to a receiving end is calculated. The link budget means a minimum signal to noise ratio (SNR) value of a signal, and according to the link budget, it is possible to know a maximum receiving power value for a clear day. Accordingly, a minimum receiving level at the maximum rainfall amount is −39 dBm, and a maximum receiving level of −21 dBm is obtained by excluding attenuation of 18 dB from the minimum receiving level of −39 dBm. Here, the minimum receiving level may cause performance deterioration due to shortage of a necessary SNR margin, and the maximum receiving level may cause performance deterioration due to the maximum receiving level being close to an input IP1 dB value of the receiver. Thus, in order to enhance a performance of the receiver, it is necessary to maintain an appropriate receiving level of the receiver.

In the case of the MM-wave point-to-point fixed communication system, since it is necessary to assure a line-of-sight (LOS) and to have a narrow beam of which angle is under 1 degree, a multipath does not exist generally. Thus, a plurality of losses in a wireless link occur at a same time, and signals are emitted by the antenna having the narrow beam so that it may be possible to assume that the MM-wave point-to-point fixed communication system has the same physical condition.

Figure 3:
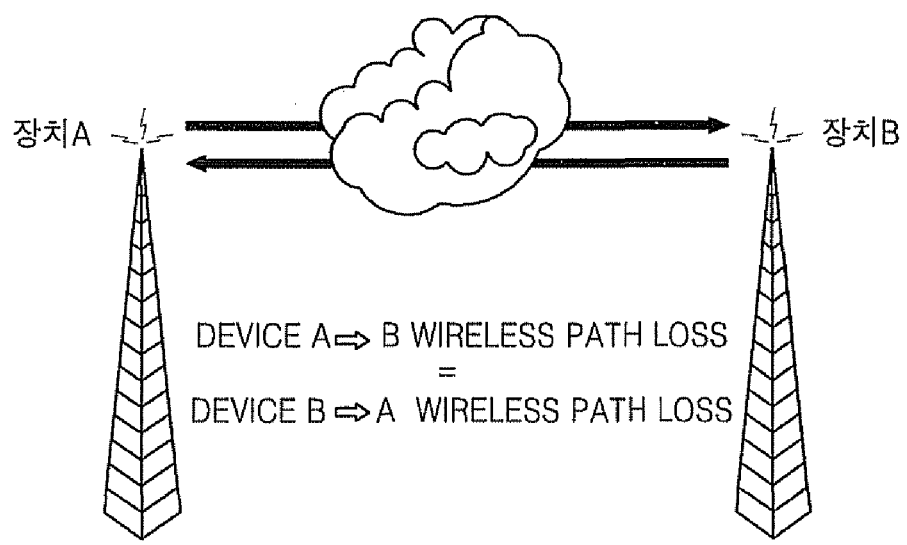
FIG. 3 is a diagram of a link scheme according to the related art.

FIG. 3 is a diagram of a link scheme according to the related art.

If output powers of transmitters in a device A and a device B are the same, and a wireless path loss from the device A to the device B is equivalent to a wireless path loss from the device B to the device A, receiving power measured in a receiver of the device B may be equivalent to receiving power measured in a receiver of the device A. Thus, by using this property, it may be possible for the device A (or the device B) to directly use power of a receiving signal, which is input to the device A (or to the device B), as a control signal of a variable attenuator of the transmitter.

Figure 4:
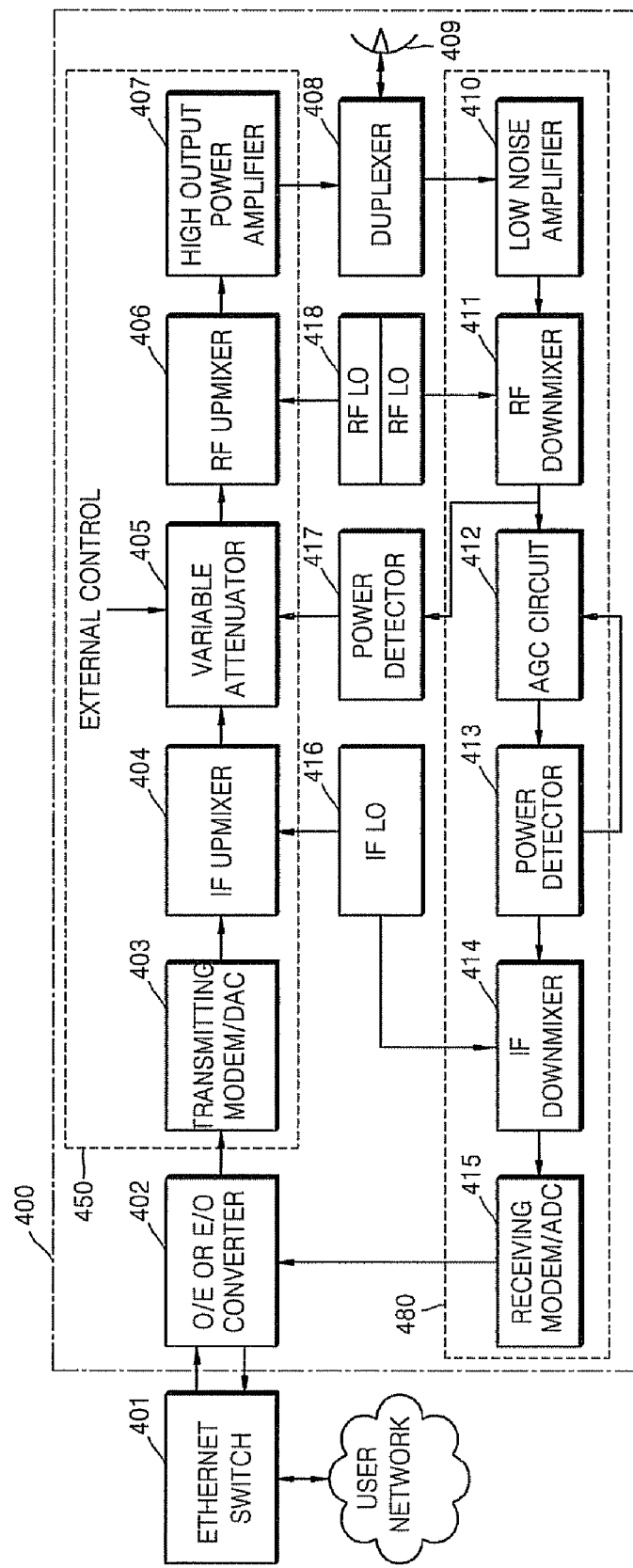
FIG. 4 is a block diagram of a structure of a transceiver according to an embodiment of the present invention.

FIG. 4 is a block diagram of a structure of a transceiver 400 according to an embodiment of the present invention.

The transceiver 400 according to the present embodiment includes a transmitter 450 for generating a transmitting signal from an input signal and transmitting the transmitting signal to an antenna, a receiver 480 for reconstructing a receiving signal received by the antenna, and an O/E or E/O converter 402, a duplexer 408, an antenna 409, an Intermediate Frequency (IF) LO 416, a power detector 417, and an RF LO 418 which are shared between the transmitter 450 and the receiver 480.

The transmitter 450 includes a transmitting modem/digital-to-analog converter (DAC) 403, an IF upmixer 404, a variable attenuator 405, an RF upmixer 406, and a high output power amplifier 407.

The receiver 480 includes a low noise amplifier 410, an RF downmixer 411, an AGC circuit 412, a power detector 413, an IF downmixer 414, and a receiving modem/analog-to-digital converter (ADC) 415.

The power detector 417 outputs a control signal for controlling output power of the transmitting signal according to power of the receiving signal, and may be positioned in the receiver 480 or may be positioned between the transmitter 450 and the receiver 480.

Hereinafter, an operation of the transmitter 450 will be described.

Data input to an Ethernet switch 401 via a user network is input to the O/E or E/O converter 402. The O/E or E/O converter 402 converts an input optical signal of the data into an electrical signal, and the transmitting modem/DAC 403 modulates an output signal of the O/E or E/O converter 402, converts the output signal from a digital signal into an analog signal, and outputs the output signal to the IF upmixer 404. The output signal of the transmitting modem/DAC 403 is up-converted to a desired frequency via the IF upmixer 404 and the RF upmixer 406 so as to be emitted wirelessly. Output power of the output signal of the transmitting modem/DAC 403 is controlled via the variable attenuator 405 for controlling desired output power. The IF upmixer 404 converts a baseband signal into an IF signal by up-mixing the output signal of the transmitting modem/DAC 403 with an output signal of the IF LO 416. The RF upmixer 406 converts the IF signal into an RF signal by up-mixing the output signal of the variable attenuator 405 with an output signal of the RF LO 418. At this time, as a control signal of the variable attenuator 405, power of the receiver 480 is used, wherein the power is detected by the power detector 417. An output signal of the RF upmixer 406 is amplified to a high output signal due to the high output power amplifier 407, and is emitted via the duplexer 408 and the antenna 409.

Hereinafter, an operation of the receiver 480 will be described.

An MM-wave signal input via the antenna 409 and the duplexer 408 is low-noise amplified by the low noise amplifier 410, is down-converted into an IF frequency by the RF downmixer 411, is amplified to a predetermined level due to an AGC in the AGC circuit 412, and then is output as a signal having the predetermined level via the power detector 413. The output signal of the power detector 413 is down-converted into a baseband signal due to the IF downmixer 414, and the receiving modem/ADC 415 converts the output signal from an analog signal into a digital signal, and performs signal demodulation. The output signal of the receiving modem/ADC 415 is converted from an electrical signal to an optical signal by the O/E or E/O converter 402, and is output to the user network via the Ethernet switch 401. The RF downmixer 411 converts an RF signal into an IF signal by down-mixing the output signal of the low noise amplifier 410 with the output signal of the RF LO 418. The IF downmixer 414 converts the IF signal into the baseband signal by down-mixing the output signal of the power detector 413 with an output signal of the IF LO 416. Output power of the IF signal converted by the RF downmixer 411 is detected by the power detector 417, and is used as the control signal of the variable attenuator 405 in the transmitter 450.

According to the present embodiment, the variable attenuator 405 in the transmitter 450 is used to control output power of the transmitter 450. The variable attenuator 405 may manually change an output signal of the transmitting signal to an externally desired value according to an external control signal, as is the case with point-to-point communication devices. Also, the variable attenuator 405 may be controlled by the control signal from the receiver 480. Instead of the variable attenuator 405, a Variable Gain Amplifier (VGA) may perform the same function.

In order to allow the variable attenuator 405 in the transmitter 450 to control the output power of the transmitter 450, it is necessary to detect power of the receiving signal in the receiver 480. The power of the receiving signal for controlling power of the transmitter 450 may be detected in an IF end of the receiver 480 or an RF end of the receiver 480. For a better result, the detection may be performed in the IF end since it is difficult to correctly measure the magnitude of the receiving signal due to a high frequency in the RF end of the receiver 480, and also, components necessary to manufacture a power detector are expensive. However, in order to measure the power of the receiving signal in the IF end of the receiver 480, a gain and a loss in a receiving link has to be correctly defined before measurement. Also, desired receiving power may be measured only when the power is detected before a signal is input to the AGC circuit 412 of the receiver 480.

Figure 5:
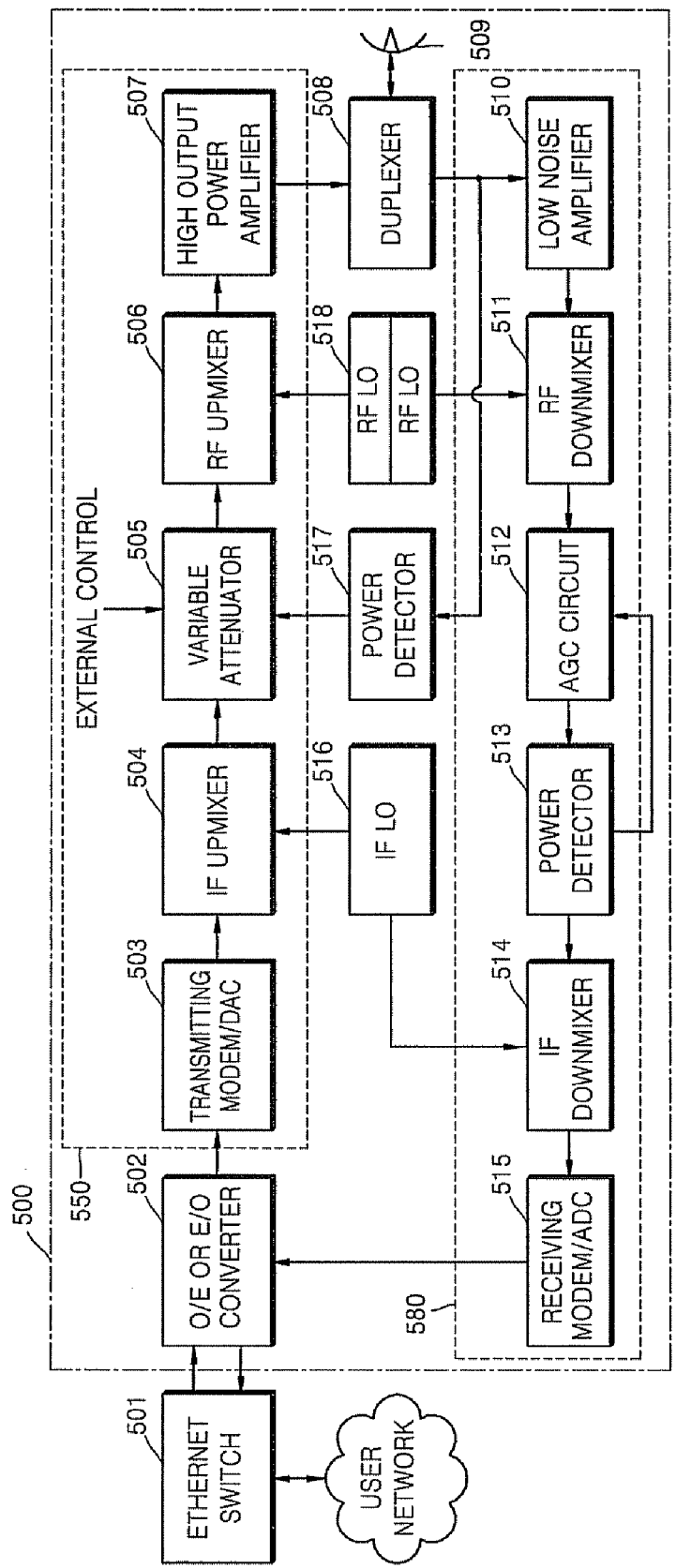
FIG. 5 is a block diagram of a structure of a transceiver according to another embodiment of the present invention.

FIG. 5 is a block diagram of a structure of a transceiver 500 according to another embodiment of the present invention.

The transceiver 500 according to the present embodiment is the same as the transceiver 400 of FIG. 4, with respect to basic principles, except for a position of an input signal of a power detector for controlling output power. Thus, detailed descriptions about the same components as those of the transceiver 400 of FIG. 4 will be omitted here.

If it is difficult to correctly define a gain and a loss in an RF end of a receiver 580, the transceiver 500 detects power of an output signal of a duplexer 508 as illustrated in FIG. 5, thereby performing a transmitting power control with a receiving power value in the RF end of the receiver 580.

In the case of a multi-channel system, power detectors 417 and 517 may be included in each of channels and thus may control output power of each of the channels of a transmitter.

According to the embodiments, the output signal of the transmitting signal is determined according to the receiving signal of a receiving end in the same device so that a possible loss value occurring in the air may be predicted. By doing so, performance of a whole link budget may be enhanced, and the transmitting signal may be rapidly controlled.

Also, according to the above embodiments, an easy control circuit may be embodied via simple detection of the power of the receiving signal.

In another embodiment, the present invention may be embodied by using at least one of a controller, a processor, and hardware that is a combination thereof which are programmed with computer software commands for executing the present invention.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, etc. The computer readable recording medium can also be distributed over network coupled computer systems so that the computer readable code is stored and executed in a distributed fashion.

While this invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. Therefore; the scope of the invention is defined not by the detailed description of the invention but by the appended claims, and all differences within the scope will be construed as being included in the present invention.

What is claimed is:

1. A transceiver comprising:
a transmitter for generating a transmitting signal from an input signal and transmitting the transmitting signal to an antenna;
a receiver for reconstructing a receiving signal received by the antenna; and
a power detector for outputting a control signal for controlling output power of the transmitting signal according to power of the receiving signal,
wherein the transmitter comprises a variable attenuator for varying the output power of the transmitting signal according to the control signal,
wherein the transmitter further comprises:
an IF upmixer for up-mixing an analog signal with an output signal of an IF LO (local oscillator), wherein the analog signal is generated by converting the input signal; and
an RF upmixer for up-mixing a signal with an output signal of an RF LO, wherein the signal is generated by varying an output signal of the IF upmixer, wherein the varying is performed by the variable attenuator.

2. A transceiver comprising:
a transmitter for generating a transmitting signal from an input signal and transmitting the transmitting signal to an antenna;
a receiver for reconstructing a receiving signal received by the antenna; and
a power detector for outputting a control signal for controlling output power of the transmitting signal according to power of the receiving signal,
wherein the transmitter comprises a variable attenuator for varying the output power of the transmitting signal according to the control signal
wherein the variable attenuator manually varies the output power of the transmitting signal according to an external control signal that is different from the control signal.

3. A transceiver comprising:
a transmitter for generating a transmitting signal from an input signal and transmitting the transmitting signal to an antenna;
a receiver for reconstructing a receiving signal received by the antenna; and
a power detector for outputting a control signal for controlling output power of the transmitting signal according to power of the receiving signal,
wherein the receiver comprises:
an RF downmixer for down-mixing an output signal of a duplexer with an output signal of an RF LO, wherein the output signal of the duplexer is generated by separating the receiving signal; and
an IF downmixer for down-mixing a signal with an output signal of an IF LO, wherein the signal is generated by amplifying an output signal of the RF downmixer according to an AGC (automatic gain control).

4. The transceiver of claim 3, wherein the power detector detects the output signal of the duplexer or the output signal of the RF downmixer.

* * * * *